United States Patent
Comeau et al.

(10) Patent No.: US 9,847,213 B2
(45) Date of Patent: Dec. 19, 2017

(54) VACUUM TRAP

(71) Applicant: GLOBALFOUNDRIES INC., Grand Cayman (KY)

(72) Inventors: Joseph K. Comeau, Alburgh, VT (US); David R. Crawford, Essex Junction, VT (US); Robert E. Desrosiers, Essex Junction, VT (US); Tracy C. Hetrick, Milton, VT (US); Mousa H. Ishaq, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 294 days.

(21) Appl. No.: 14/723,703

(22) Filed: May 28, 2015

(65) Prior Publication Data

US 2015/0262795 A1    Sep. 17, 2015

Related U.S. Application Data

(62) Division of application No. 13/425,470, filed on Mar. 21, 2012, now Pat. No. 9,057,388.

(51) Int. Cl.
*H01J 37/32* (2006.01)
*C23C 16/50* (2006.01)
(Continued)

(52) U.S. Cl.
CPC .. *H01J 37/32633* (2013.01); *C23C 16/45536* (2013.01); *C23C 16/45587* (2013.01);
(Continued)

(58) Field of Classification Search
CPC .............. C23C 16/50; C23C 16/45536; C23C 16/45587; C23C 16/45589; H01J 1/00;
(Continued)

(56) References Cited

U.S. PATENT DOCUMENTS

| 512,681 A * | 1/1894 | Clute ...................... B01D 45/08 55/446 |
| 1,867,325 A * | 7/1932 | Neville ................ B01D 53/944 422/177 |

(Continued)

FOREIGN PATENT DOCUMENTS

| JP | 824503 | 1/1996 |
| JP | 2001131748 | 5/2001 |

OTHER PUBLICATIONS

Oliver et al.; A Novel Cold Trap Design for Diffusion Pumps; Instrumentation and Development; vol. 3, No. 5 1995; pp. 3-7.
(Continued)

*Primary Examiner* — Rudy Zervigon
(74) *Attorney, Agent, or Firm* — Thompson Hine LLP; Anthony Canale (57) ABSTRACT

A vacuum trap, a plasma etch system using the vacuum trap and a method of cleaning the vacuum trap. The vacuum trap includes a baffle housing; and a removable baffle assembly disposed in the baffle housing, the baffle assembly comprising a set of baffle plates, the baffle plates spaced along a support rod from a first baffle plate to a last baffle plate, the baffle plates alternately disposed above and below the support rod and alternately disposed in an upper region and a lower region of the baffle housing.

19 Claims, 5 Drawing Sheets

(51) Int. Cl.
  *C23C 16/455* (2006.01)
  *C23F 1/00* (2006.01)
  *F04F 9/00* (2006.01)

(52) U.S. Cl.
  CPC ........ *C23C 16/45589* (2013.01); *C23C 16/50* (2013.01); *C23F 1/00* (2013.01); *F04F 9/00* (2013.01); *H01J 37/32834* (2013.01); *H01J 2237/18* (2013.01); *H01J 2237/1825* (2013.01)

(58) Field of Classification Search
  CPC ........... H01J 37/32633; H01J 37/32834; H01J 2237/18; H01J 2237/1825; C23F 1/00; F04F 9/00
  USPC .................................. 118/723 R; 156/345.34
  See application file for complete search history.

(56) References Cited

U.S. PATENT DOCUMENTS

| | | | | |
|---|---|---|---|---|
| 4,253,641 A * | 3/1981 | VanRyck | .............. | F16K 1/2261 251/306 |
| 4,968,336 A | 11/1990 | Reimanis et al. | | |
| 5,085,673 A | 2/1992 | Bentley et al. | | |
| 5,819,683 A * | 10/1998 | Ikeda | .................... | B01D 53/34 118/715 |
| 6,099,649 A * | 8/2000 | Schmitt | ............... | B01D 53/002 118/715 |
| 6,238,514 B1 * | 5/2001 | Gu | ....................... | B01D 5/0036 118/715 |
| 6,547,844 B2 * | 4/2003 | Rikyuu | ................. | B01D 45/08 55/315.1 |
| 6,966,936 B2 * | 11/2005 | Yamasaki | ............... | C23C 16/18 118/715 |
| 6,994,830 B1 * | 2/2006 | Raybone | ........... | B01D 53/0446 204/164 |
| 7,168,682 B2 * | 1/2007 | Nanba | .................. | F02D 9/1045 251/305 |
| 7,727,296 B2 | 6/2010 | Tojo et al. | | |
| 7,837,770 B2 | 11/2010 | Lee et al. | | |
| 7,867,312 B2 * | 1/2011 | Engerran | ............ | C23C 16/4486 55/318 |
| 7,988,755 B2 | 8/2011 | Cho et al. | | |
| 8,057,564 B2 | 11/2011 | Tsuji | | |
| 8,097,179 B2 | 1/2012 | Williams et al. | | |
| 8,512,452 B2 * | 8/2013 | Fischer | ............... | C23C 16/4412 55/385.2 |
| 9,057,388 B2 * | 6/2015 | Comeau | .................... | F04F 9/00 |
| 2001/0003892 A1 * | 6/2001 | Rikyuu | .................. | B01D 45/08 55/315.2 |
| 2003/0037730 A1 * | 2/2003 | Yamasaki | ............... | C23C 16/18 118/715 |
| 2004/0238123 A1 * | 12/2004 | Becknell | ........... | H01J 37/32357 156/345.33 |
| 2005/0061150 A1 * | 3/2005 | Mardian | .............. | B01D 5/0006 95/288 |
| 2006/0169411 A1 * | 8/2006 | Han | .................... | C23C 16/4412 156/345.29 |
| 2006/0264045 A1 * | 11/2006 | Gu | .................... | C23C 16/45544 438/680 |
| 2007/0175188 A1 * | 8/2007 | Tsuji | ....................... | B01D 45/08 55/444 |
| 2008/0072585 A1 * | 3/2008 | Ikeda | .................. | C23C 16/4412 60/324 |
| 2008/0166881 A1 * | 7/2008 | Taniyama | ........... | C23C 16/4412 438/758 |
| 2009/0114296 A1 * | 5/2009 | Tsuda | .................... | F16K 11/044 137/613 |
| 2009/0211210 A1 * | 8/2009 | Engerran | ............ | C23C 16/4412 55/344 |
| 2009/0217634 A1 * | 9/2009 | Choi | ...................... | B01D 45/08 55/426 |
| 2011/0252969 A1 * | 10/2011 | Fischer | ............... | C23C 16/4412 95/272 |
| 2013/0248112 A1 * | 9/2013 | Comeau | .................... | F04F 9/00 156/345.1 |

OTHER PUBLICATIONS

Office Action (dated Jan. 26, 2015) for U.S. Appl. No. 13/425,470, filed Mar. 21, 2012.
Amendment filed Feb. 18, 2015 in response to Office Action (dated Jan. 26, 2015) for U.S. Appl. No. 13/425,470, filed Mar. 21, 2012.
Notice of Allowance (dated Mar. 2, 2015) for U.S. Appl. No. 13/425,470, filed Mar. 21, 2012.

* cited by examiner

VACUUM TRAP

RELATED APPLICATIONS

This application is a division of U.S. patent application Ser. No. 13/425,470 filed on Mar. 21, 2012.

FIELD OF THE INVENTION

The present invention relates to the field of vacuum systems; more specifically, it relates to a vacuum trap for a vacuum system and a plasma etch system including a vacuum system having the vacuum trap.

BACKGROUND

In plasma etch tools that use fluoro-carbon and/or sulfur-fluorine compounds as the reactant gases, fluorine containing polymers build up on the vacuum pump lobes and vacuum pump exhaust port reducing the pump rates and requiring expensive cleaning and tool downtime. Accordingly, there exists a need in the art to mitigate the deficiencies and limitations described hereinabove.

SUMMARY

A first aspect of the present invention is an apparatus, comprising a baffle housing; and a removable baffle assembly disposed in the baffle housing, the baffle assembly comprising a set of baffle plates, the baffle plates spaced along a support rod from a first baffle plate to a last baffle plate, the baffle plates alternately disposed above and below the support rod and alternately disposed in an upper region and a lower region of the baffle housing.

A second aspect of the present invention is a system comprising: a plasma etch tool and a vacuum pump; a vacuum trap disposed between an exhaust port of the plasma etch tool and a pumping port of a vacuum pump, the vacuum trap comprising: a baffle housing; and a removable baffle assembly disposed in the baffle housing, the baffle assembly comprising a set of baffle plates, the baffle plates spaced along a support rod from a first baffle plate to a last baffle plate, the baffle plates alternately disposed above and below the support rod and alternately disposed in an upper region and a lower region of the baffle housing.

A third aspect of the present invention is a method, comprising: providing a plasma etch tool and a vacuum pump; placing a vacuum trap in a pumping line between an exhaust port of the plasma etch tool and a pumping port of the vacuum pump, the vacuum trap comprising: a baffle housing; a removable baffle assembly disposed in the baffle housing, the baffle assembly comprising a set of baffle plates, the baffle plates spaced along a support rod from a first baffle plate to a last baffle plate, the baffle plates alternately disposed above and below the support rod and alternately disposed in an upper region and a lower region of the baffle housing; and removable polymeric seals on edges of the baffle plates adjacent to internal walls of the baffle housing, the polymer seals touching the internal walls of the baffle housing; periodically removing the baffle housing and the baffle assembly from the pumping line and removing the baffle assembly from the baffle housing; cleaning the baffle housing and the baffle assembly by placing the baffle housing in an oven heated to a temperature above room temperature to melt and thereby remove any polymeric residue from surfaces of the baffle housing and the baffle assembly; removing the baffle housing and the baffle assembly from the oven; and after the cleaning, re-inserting the baffle assembly into the baffle housing and re-inserting the baffle housing into the pumping line.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Vacuum traps according to embodiments of the present invention are designed to collect polymeric by-products and other residues generated by a plasma etch tool. Vacuum traps according to embodiments of the present invention are suitable for use at ambient room temperature. Vacuum traps according to embodiments of the present invention do not need to be cooled below ambient room temperature in order to trap polymer by-products or other residues. In one example, ambient room temperature is between about 20° C. and about 25° C. Vacuum traps according to embodiments of the present invention do not require mechanical cooling by any (e.g., forced refrigerated or room temperature gas or liquid flow directed to the body, endcaps or baffle assembly of the vacuum trap). However, mechanical cooling is optional. The baffles used by the vacuum traps according to embodiments of the present invention are not helical but present multiple collection surfaces that are perpendicular to the pumping direction.

Figure 1:
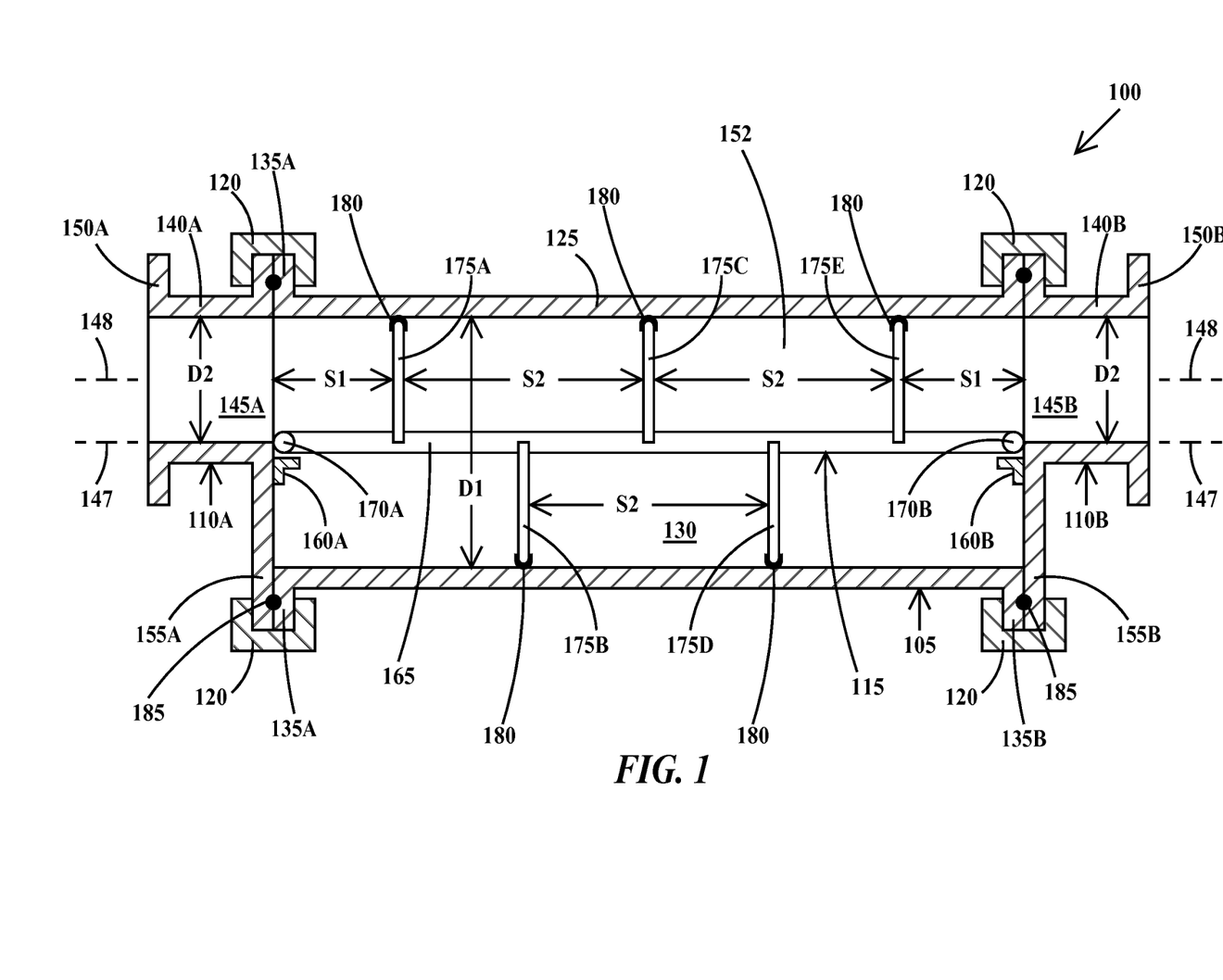
FIG. 1 is a cross-sectional view of a vacuum trap according to an embodiment of the present invention.

FIG. 1 is a cross-sectional view of a vacuum trap according to an embodiment of the present invention. In FIG. 1, a vacuum trap 100 includes a baffle housing 105, first end cap 110A and second end cap 110B, a baffle assembly 115 and quick release clamps 135 for holding end caps 110 to body 115. Quick release clamps 135 allow quick removal of vacuum trap 100 from the plasma etch system and removal of end caps 110A and 110B from baffle housing 105. Baffle housing 105 has a cylindrical body 125 having a first bore 130 of uniform diameter D1 open at opposite ends and integral flanges 135A and 135B proximate to the ends of body 105 for clamping of body 105 to end caps 110A and 110B. End caps 110A and 110B include cylindrical bodies 140A and 140B, with first cylindrical body 140A having a second bore 145A of uniform diameter D2 and second cylindrical body 140B having a third bore 145B of uniform diameter D2, the second and third bores being open at opposite ends, integral flanges 150A and 150B, and integral flange plates 155A and 155B for joining end caps 110A and 110B to body 105. First bore 145A and second bore 145B are offset from the longitudinal axes 147 of baffle housing 105 so first bore 145A and second bore 145B align with only the upper region 152 of first bore 130. Flanges 150A and 150B are provided to clamp first and second end caps 110A and 110B to other pipes or units of a vacuum system. Brackets 160A and 160B are attached to the surface of flange plates 155A and 155B for aligning baffle assembly 115 within baffle housing 105. Baffle assembly 115 includes a central rod 165 having rod handles 170A and 170B attached at opposite ends of rod 165. Attached to rod 165 are baffle plates 175A, 175B, 175C, 175D and 175E. Baffle plates 175A, 175B and 175E are disposed in an upper region of first bore 130 that is aligned with first bore 145A of end cap 110A and second bore 145B of end cap 110B. Baffle plate 175B is disposed between baffle plates 175A and 175C. Baffle plate 175D is disposed between baffle plates 175C and 175E. Baffle plates 175B and 175D are disposed in a lower region of bore that is not aligned with first bore 145A of end cap 110A and second bore 145B of end cap 110B. Baffle plates 175A and 175E are spaced a distance S1 from respective ends of baffle housing 105. Baffle plates 175A and 175C are spaced a distance S2 apart. Baffle plates 175C and 175E are spaced a distance S2 apart. Baffle plates 175A and 175C are spaced a distance S2 apart. Disposable seals 180 are provided on the circular edges of baffle plates 175A, 175B, 175C, 175D and 175E to provide a seal between the baffle plates and the inside wall of baffle housing 105. O-ring seals 185 are provided to seal flanges 135A and 135B to flange plates 155A and 155B. Baffle assembly is removeable from body 105 after disconnecting first and second end caps 110A and 110B from baffle housing 105. While five baffle plates are illustrated, there may be as few as three or more than five, with odd numbers of baffle plates being preferred when vacuum trap 100 is assembled as illustrated in FIG. 1. However, even numbers of baffle plates may be used if the first end cap 110A is mounted to baffle housing 105 and rotated 180° relative to the second end cap 110B so the respective first and second bores 145A and 145B are not aligned (i.e., an axis passing through the centers of first and second bores 145A and 145B is not parallel to axis 147 of FIG. 1 but crosses axis 147). Then at least two baffle plates may be used.

Bracket 160 along with the length of rod 165 and the orientation of rod handles 170A and 170B relative to baffle plates 175A, 175B, 175C, 175D and 175E prevent the baffle plates of baffle assembly 115 from being assembled with the baffle plates rotated out of proper alignment relative to first bore 145A of end cap 110A and second bore 145B of end cap 110B. Brackets 160 A and 160B also forces the longitudinal axes 148 of bores 145A and 145B of end caps 110A and 110B to be aligned. Vacuum trap 100 cannot be assembled until end caps 110A and 110B and baffle assembly 115 are aligned properly.

In one example, D1 is about equal to the bore of the pump intake and exhaust ports of the vacuum pump. In one example D2 is equal to about half D1. In one example, S1 is about equal to D2. In one example, S2 is equal to about twice S1 so the distance between all adjacent pairs of baffle plates is about S1. Thus, for a three inch vacuum system, S1 and D2 are about three inches and D1 and S2 are about six inches. In one example, baffle housing 105 and end caps 110A and 110B are aluminum. In one example, baffle assembly 115 is stainless steel and rod 165 and handles 170A and 170B and baffle plates 175A, 175B, 175C, 175D and 175E are welded together. In one example, seals 180 are formed from a polymer, examples of which include, but are not limited to, polyvinyl chloride, polyethylene, silicone, polyurethane and fluoro-polymers.

Figure 2A:
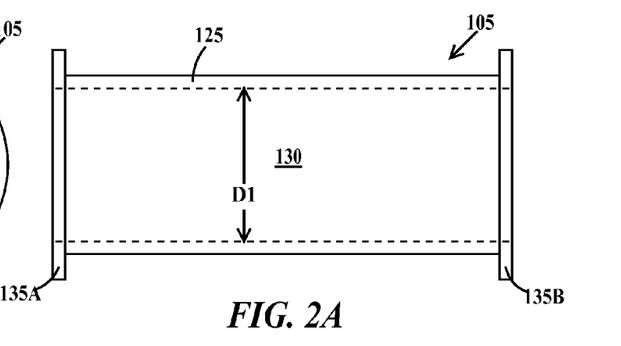
FIG. 2A is a side view and FIG. 2B is end view of the baffle housing of the vacuum trap according to an embodiment of the present invention.
Figure 2B:
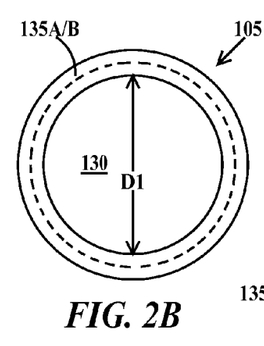

FIG. 2A is a side view and FIG. 2B is end view of the baffle housing of the vacuum trap according to an embodiment of the present invention. In FIGS. 2A and 2B baffle housing 105 is an open ended cylinder having flanges 135 at opposite ends of body 125.

Figure 3A:
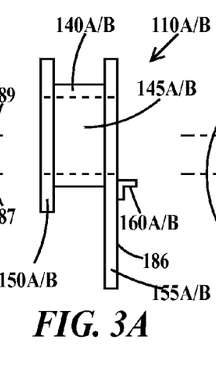
FIG. 3A is a side view and FIGS. 3B and 3C are opposite end views of the end caps of the vacuum trap according to an embodiment of the present invention.
Figure 3B:
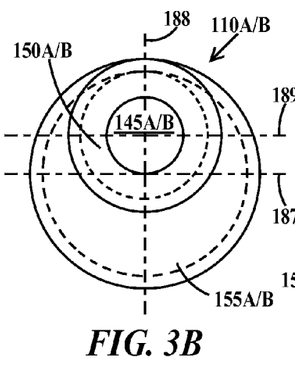
Figure 3C:
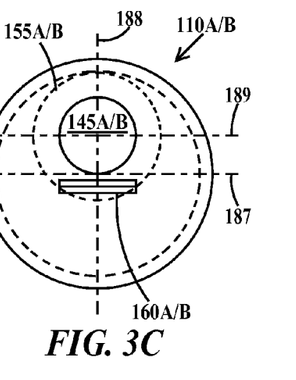

FIG. 3A is a side view and FIGS. 3B and 3C are opposite end views of the end caps of the vacuum trap according to an embodiment of the present invention. In FIG. 3A, brackets 160A and 160B are mounted to the inside walls 186A and 186B of flange plate 155 just below bores 145A and 145B. In FIG. 3B, flange plates 155A and 155B are divided into quadrants by mutually perpendicular axes 187 and 188 passing through the center of flange plates 155A and 155B. The point where axes 187 and 188 cross is longitudinal axis 147 of FIG. 1. The perimeter of bores 145A and 145B are proximate to axis 187 and is bisected by axis 188. Bores 145A and 145B and flanges 150A and 150B are divided into quadrants by mutually perpendicular axes 189 and 188 passing through the center of flange plates 155A and 155B. The point where axes 188 and 189 cross is longitudinal axis 148 of FIG. 1. Axes 187 and 189 are parallel and axis 188 is perpendicular to axes 187 and 189. Axes 187, 188 and 147 of FIG. 1 are mutually orthogonal. Axes 188, 189 and 148 of FIG. 1 are mutually orthogonal. In FIG. 3C, brackets 160A and 160B are mounted to flange plates 155A and 155B with their lengths parallel to and below axis 187.

Figure 4:
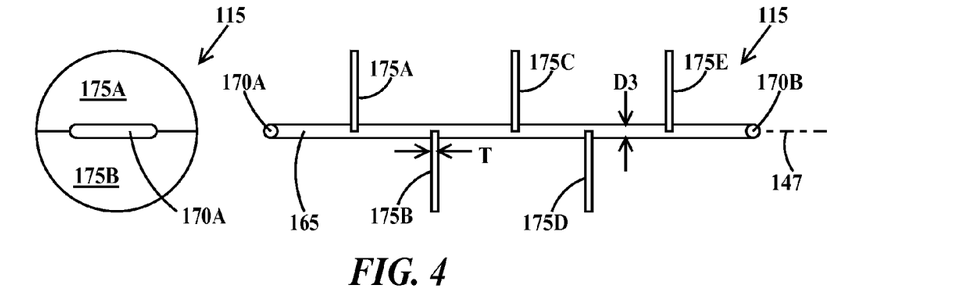
FIGS. 4 and 5 are side views of the baffle of the vacuum trap according to an embodiment of the present invention.
Figure 5:
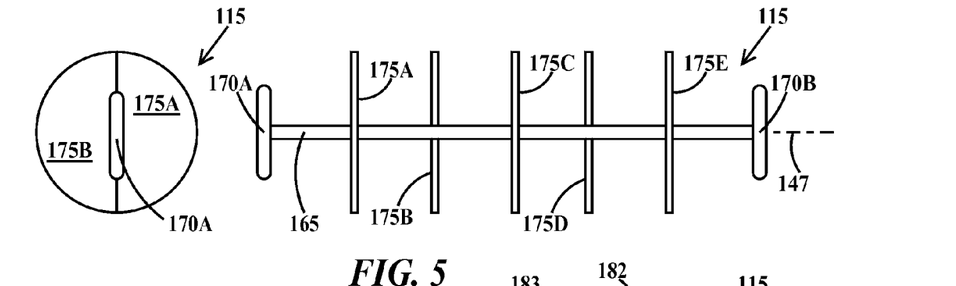

FIGS. 4 and 5 are side views of the baffle of the vacuum trap according to an embodiment of the present invention. In FIG. 4, baffle plates 175A, 175B, 175C, 175D and 175E are semi-circular plates located on alternate sides of rod 165. Handle 170A (and handle 170B) have their respective longitudinal axes parallel to the flat edges of baffle plates 175A, 175B, 175C, 175D and 175E. Rod 165 has a diameter D3 and baffle plates 175A, 175B, 175C, 175D and 175E have a thickness T. It is preferable that rod 165 has a diameter of less than about 1/10 the diameter of bore 130 of baffle housing 105 (see FIGS. 2A and 2B) so as not to restrict the exhaust path through the baffle housing. In one example, D3 is about ½ of an inch. In one example, T is about 3/16 of an inch. FIG. 5 is FIG. 4 rotated 90° about longitudinal axis 147.

Figure 6:
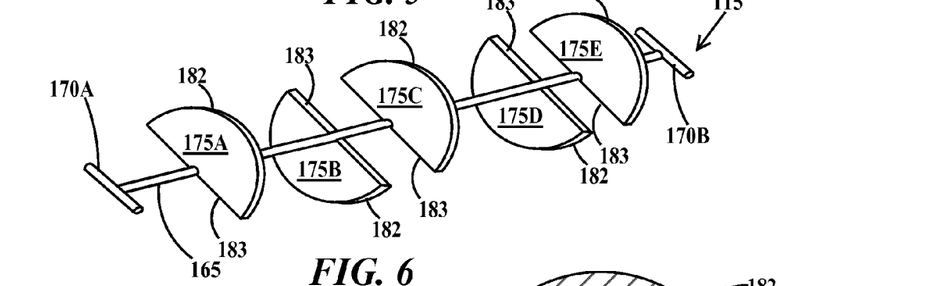
FIG. 6 is an isometric view of the baffle of the vacuum trap according to an embodiment of the present invention.

FIG. 6 is an isometric view of the baffle of the vacuum trap according to an embodiment of the present invention. In FIG. 6, curved edges 182 of baffle plates 175A, 175C and 175E are aligned to each other and curved edges 182 of baffle plates 175B and 175D are aligned to each other. The flat edges 183 of all baffle plates 175A, 175B, 175C, 175D and 175E and the longitudinal axes of handles 170A and 170B are aligned in parallel. In the example of FIG. 6, baffle plates 175A, 175B, 175C, 175D and 175E are solid and contain no openings.

Figure 7A:
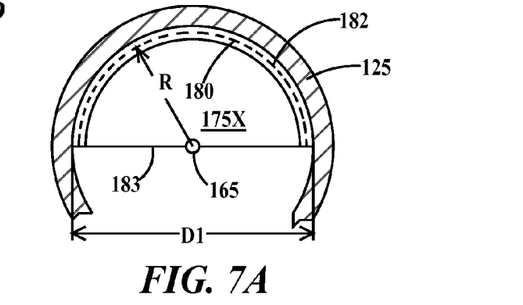
FIGS. 7A and 7B illustrate the seal between the baffle and the baffle housing of the vacuum trap according to an embodiment of the present invention.
Figure 7B:
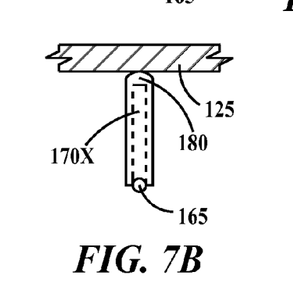

FIGS. 7A and 7B illustrate the seal between the baffle and the baffle housing of the vacuum trap according to an embodiment of the present invention. FIG. 7B is rotated 90° from FIG. 7A. In FIGS. 7A and 7B, an exemplary baffle plate 175X has a radius R which is less than half the diameter of bore D1 to accommodate seals 180. Seals 180 not only seal alternate sections of the vacuum trap from each other, but help keep the baffle assembly aligned in first bore 130 of baffle housing 125 (see FIG. 1) as the baffle assembly is inserted into and removed from the first bore 130. Also, seals 180 allow rotational adjustment along axis 147 (see FIG. 1) of baffle assembly 125 without scratching the surfaces of first bore 130.

Figure 8:
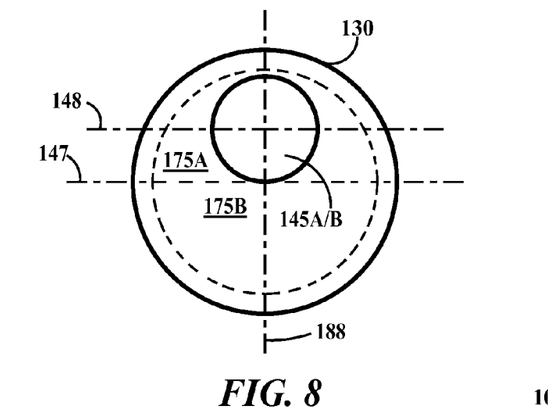
FIG. 8 illustrates the proper alignment of baffle plates to the end caps of the vacuum trap according to an embodiment of the present invention.

FIG. 8 illustrates the proper alignment of baffle plates to the end caps of the vacuum trap according to an embodiment of the present invention. In FIG. 8, the flat edges of baffle plates 175A and 175B are aligned with axis 147 within first bore 130 (of the baffle housing) and baffle plate 175A is in line with third bore 145B (of the end cap). Thus, looking straight into second bore 145B, baffle plate 175A would be visible while baffle plate 175B would not be visible.

Figure 9A:
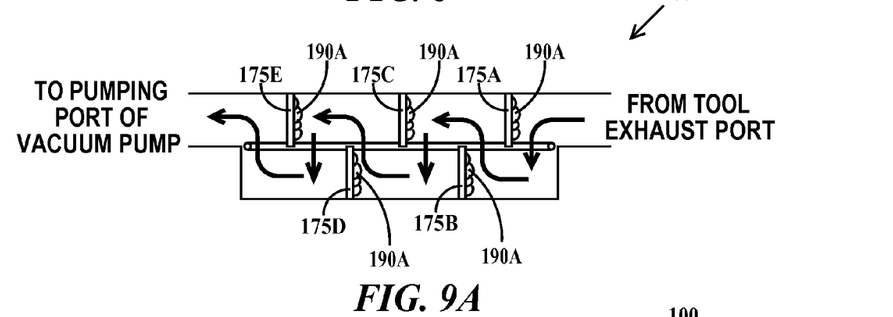
FIGS. 9A and 9B illustrate the use of the vacuum trap according to an embodiment of the present invention.
Figure 9B:
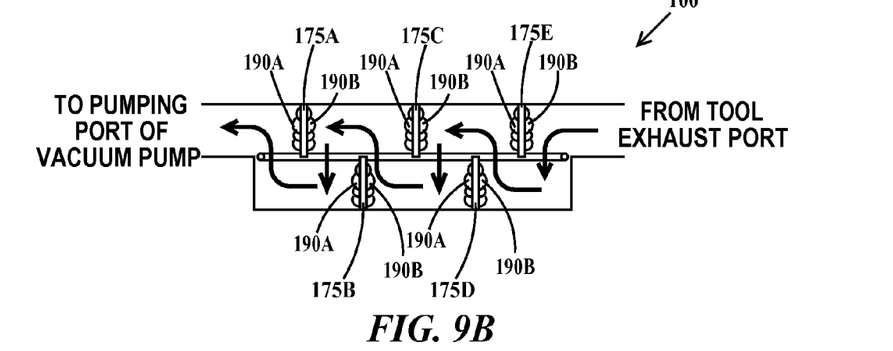

FIGS. 9A and 9B illustrate the use of the vacuum trap according to an embodiment of the present invention. In FIG. 9A, as the exhaust from the plasma tool passes through vacuum trap 100, by-products 190A of the plasma etch process (polymers, vapors, particles and other residues and particles) impinge on front surfaces of baffle plates 175A, 175B, 175C, 175D and 175E facing the exhaust port of the plasma tool, baffle plate 175A being closet to the exhaust port. In FIG. 9B, the entire vacuum trap 100 has been removed from the pumping line, and re-inserted in a reversed position into the pumping line with baffle plate 175E closet to the exhaust port of the plasma system and by-products 190B are collected on the back surfaces of the baffle plates. Baffle assembly 115 has not been removed from baffle housing 105 nor have the endcaps 110 (see FIG. 1) been removed from the baffle housing. This procedure does not disturb polymer built up on the interiors surfaces of vacuum trap 100 and is the reason that the first and second end caps 110A and 110B are the same design. Vacuum trap 100 may be cleaned after collecting by-product 190A and not re-positioned as in FIG. 9B or cleaned after collecting both byproduct 190A and 190B.

Figure 10:
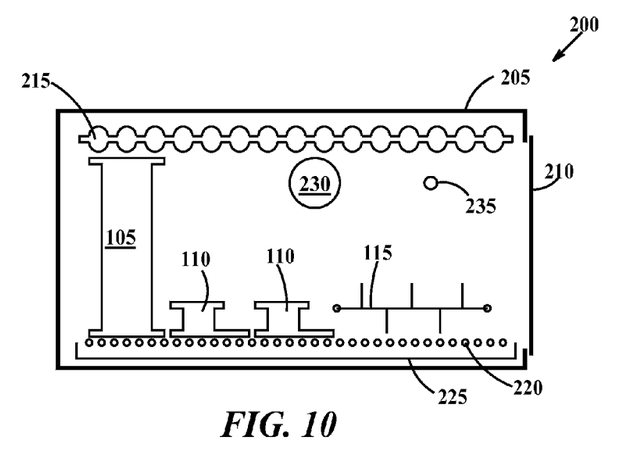
FIG. 10 illustrates a method of cleaning the vacuum trap according to an embodiment of the present invention.

FIG. 10 illustrates a method of cleaning the vacuum trap according to an embodiment of the present invention. In FIG. 10, an oven 200 includes a chamber 205 having a door 210 and a heater 215. A rack 220 is provided in a tray 225. An exhaust port 230 and optional purge gas inlet 235 are also provided to chamber 205. To clean the vacuum trap, the vacuum trap is removed from the plasma etch system (see FIG. 11), end caps 110A and 110B removed from baffle housing 105, baffle assembly 115 is removed from baffle housing 105, seals 180 (see FIGS. 1, 7A and 7B) removed and discarded and the baffle housing, baffle assembly and end caps placed on rack 220. Oven 200 is heated to about 180° C. and the by-product collected (some collects on baffle housing 105 and end caps 110A and 110B as well as on baffle assembly 115) melts and drips into tray 225. The temperature of oven 200 is less than the temperature that the collected by-products will decompose at to avoid releasing fluorine compounds. After cleaning, new seals are placed on the baffle plates and the baffle assembly is re-installed on the plasma etch system. Alternatively, if polymer build-up makes disassembly of the vacuum trap difficult, the entire assembled vacuum assembly (baffle housing, baffle assembly and both endcaps) can be placed in the oven, and after most of the polymer is removed, the vacuum trap can be disassembled as and the individual parts placed in the oven as described supra.

Figure 11:
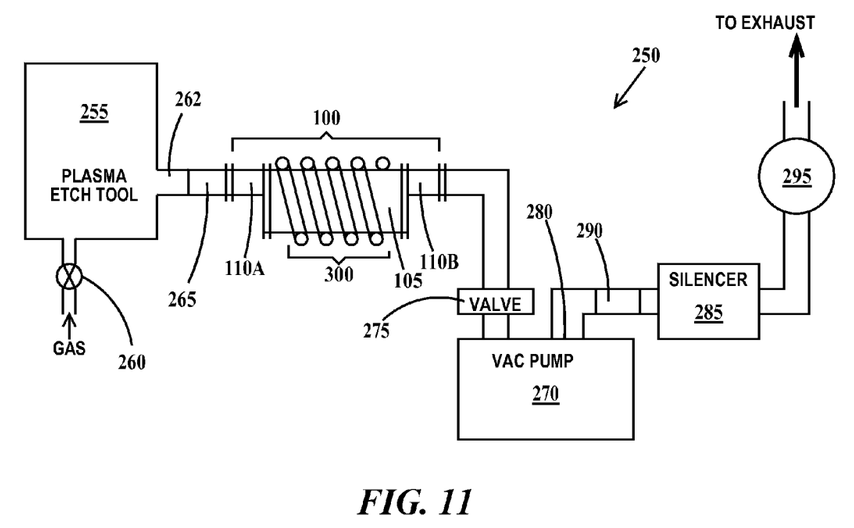
FIG. 11 is a schematic diagram of an exemplary plasma etch system including the vacuum trap according to an embodiment of the present invention.

FIG. 11 is a schematic diagram of an exemplary plasma etch system including the vacuum trap according to an embodiment of the present invention. In FIG. 11, a plasma etch system 250 includes a plasma etch tool 255 having one or more gas inlets 260 and an exhaust port 262. Plasma etch tool 255 includes an RF generator and a DC power supply (not shown). An optional heated fore line 265 is placed between the input side end cap 110A of vacuum trap 100 and heated fore line 265. In one example, heated fore line 265 is heated to about 85° C. The output side end cap 110B is connected to the pumping port of vacuum pump 270 through a throttling valve 275. The exhaust port 280 of vacuum pump 270 is connected to an input port of silencer 285 by an optional heated exhaust line 280. The output port of silencer 285 is connected to an exhaust fan 295. While no scrubber is required, a scrubber after exhaust fan 295 may be provided. While forced cooling of vacuum trap 100 is not required, an optional cooling coil 300 may be provided around baffle housing 105, though if cooled to too low a temperature enough polymer may be collected on the walls of the baffle housing to make disassembly of the vacuum trap difficult.

While the baffle housing has been described as having an annular ring cross-section with the baffle assembly and end-caps configured to fit a baffle housing having n annular ring cross-section, baffle bodies may have other cross-sections, such as square or rectangular with the baffle assembly and end-caps configured to fit baffle bodies having square or rectangular or other cross-sections. However, a baffle housing having an annular ring cross-section is preferred because of ease of construction and reduced cost and weight.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    a cylindrical baffle housing having a first end, a second end, and a circular first bore open at the first end and the second end;
    a first end cap having a circular second bore, the first end cap removably mounted to said first end of the baffle housing;
    a second end cap having a circular third bore, said second end cap removably mounted to said second end of said baffle housing;
    a support rod; and
    a removable baffle assembly disposed in said baffle housing, said baffle assembly comprising a set of baffle plates, said baffle plates spaced along the support rod from a first baffle plate to a last baffle plate, and said baffle plates alternatively disposed above and below said support rod,
    wherein said baffle plates disposed above said support rod are disposed entirely in an upper region of said baffle housing, and said baffle plates disposed below said support rod are disposed entirely in a lower region of said baffle housing.
2. The apparatus of claim 1, wherein said baffle plates are semi-circular in shape.

3. The apparatus of claim 2, further comprising:
removable polymeric seals on said circular edges of said baffle plates, said removable polymeric seals touching the sidewall of said first bore.

4. The apparatus of claim 2, wherein said second bore of said first end cap is aligned with said upper region of said first bore and faces a first baffle plate of said set of baffle plates, and said third bore of said second end cap aligned with said upper region of said first bore and facing a last baffle plate of said set of baffle plates.

5. The apparatus of claim 4, wherein an offset axis passing through respective centers of said second and third bores passes through said upper region of said first bore, and the offset axis is parallel to and offset from a longitudinal axis of said baffle housing.

6. The apparatus of claim 4, wherein said baffle assembly is configured to (i) allow positioning of said first baffle plate in said upper region of said first bore and immediately adjacent to said second bore and to allow positioning of said last baffle plate in said upper region of said first bore and immediately adjacent to said third bore and (ii) allow positioning of said last baffle plate in said upper region of said first bore and immediately adjacent to said second bore and to allow positioning of said first baffle plate in said upper region of said first bore and immediately adjacent to said third bore and (iii) allow positioning of said second baffle plate in said upper region of said first bore and immediately adjacent to said second bore and to allow positioning of said a next to last baffle plate in said upper region of said first bore and immediately adjacent to said third bore and (iv) allow positioning of said next to last baffle plate in said upper region of said first bore and immediately adjacent to said second bore and to allow positioning of said second baffle plate in said upper region of said first bore and immediately adjacent to said third bore.

7. The apparatus of claim 4, further comprising:
a handle on a first end of said support rod; and
a bracket mounted on an inside wall of said first end cap under said second bore,
wherein, a longitudinal axis of said handle, a flat edge of bracket and said flat edges of said baffle plates are co-aligned so as to (i) position said first baffle plate and said last baffle plate in said upper region of said baffle housing and to align said first baffle plate and said last baffle plate to said second bore or (ii) position said a second baffle plate and a next to last baffle plate in said upper region of said baffle housing and to align said second baffle plate and said next to last baffle plate to said second bore.

8. The apparatus of claim 7, further comprising:
an additional handle on a second end of said support rod;
an additional bracket on an inside wall of said second end cap under said third bore; and
wherein, said longitudinal axis of said handle, a longitudinal axis of said additional handle, said flat edge of said bracket, a flat edge of said additional bracket and said flat edges of said baffle plates are co-aligned.

9. The apparatus of claim 4, further comprising:
a handle on a first end of said support rod;
a bracket mounted on an inside wall of said first end cap under said second bore, said bracket; and
wherein said handle, when in contact with said bracket, prevents said support rod from rotating.

10. The apparatus of claim 1, wherein said baffle plates disposed above said support rod are spaced a same first distance apart along said support rod and said baffle plates disposed below said support rod are spaced a same second distance apart along said support rod.

11. The apparatus of claim 10 wherein said first distance and said second distance are the same.

12. The apparatus of claim 10, wherein said baffle plates disposed above said support rod are disposed midway between said baffle plates disposed below said support rod.

13. The apparatus of claim 10, further comprising:
a cooling coil disposed around an outside surface of said baffle housing.

14. The apparatus of claim 1, wherein said baffle assembly is symmetrical about an axis perpendicular to a longitudinal axis of said support rod.

15. The apparatus of claim 1 wherein the first bore has a first diameter, the second bore has a second diameter less than the first diameter, and the third bore has a third diameter less than the first diameter.

16. The apparatus of claim 15, wherein said second diameter and said third diameter are the same.

17. The apparatus of claim 1, wherein said baffle plates have respective flat and curved edges.

18. The apparatus of claim 17, further comprising:
removable polymeric seals on said curved edges of said baffle plates, said removable polymeric seals touching the sidewall of said first bore.

19. The apparatus of claim 1, wherein said apparatus is not mechanically cooled by forced fluid or gas flow.

* * * * *